(12) United States Patent
Kobayashi et al.

(10) Patent No.: US 8,491,751 B2
(45) Date of Patent: *Jul. 23, 2013

(54) PLASMA PROCESSING APPARATUS

(75) Inventors: Hiroyuki Kobayashi, Kodaira (JP); Masaru Izawa, Hino (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/457,082

(22) Filed: Apr. 26, 2012

(65) Prior Publication Data

US 2012/0211163 A1    Aug. 23, 2012

Related U.S. Application Data

(63) Continuation of application No. 13/018,838, filed on Feb. 1, 2011, now Pat. No. 8,197,635, which is a continuation of application No. 11/355,162, filed on Feb. 16, 2006, now abandoned.

(30) Foreign Application Priority Data

Jul. 27, 2005 (JP) .................................. 2005-217538

(51) Int. Cl.
- C23F 1/00 (2006.01)
- H01L 21/306 (2006.01)
- C23C 16/00 (2006.01)
- B05C 13/00 (2006.01)

(52) U.S. Cl.
USPC ............ 156/345.31; 156/345.32; 156/345.51; 156/915; 118/500; 118/719; 118/728

(58) Field of Classification Search
USPC ... 156/345.31, 345.32, 345.51, 915; 118/500, 118/719, 728
See application file for complete search history.

(56) References Cited

U.S. PATENT DOCUMENTS

| | | | |
|---|---|---|---|
| 5,275,683 A | 1/1994 | Arami et al. | |
| 5,384,008 A * | 1/1995 | Sinha et al. | 438/694 |
| 5,529,657 A | 6/1996 | Ishii | |
| 5,556,500 A | 9/1996 | Hasegawa et al. | |
| 5,606,485 A | 2/1997 | Shamouilian et al. | |

(Continued)

FOREIGN PATENT DOCUMENTS

| | | |
|---|---|---|
| JP | 2002-190511 A | 7/2002 |
| JP | 2004-200219 | 7/2004 |
| JP | 2004-200353 | 7/2004 |

OTHER PUBLICATIONS

Entire Prosecution of U.S. Appl. No. 11/355,162 to Kobayashi, et al., filed Feb. 16, 2006, entitled "Plasma Processing Apparatus Including Etching Processing Apparatus and Ashing Processing Apparatus and Plasma Processing Method Using Plasma Processing Apparatus".

(Continued)

*Primary Examiner* — Karla Moore
(74) *Attorney, Agent, or Firm* — McDermott Will & Emery LLP

(57) ABSTRACT

A diameter of a mounting unit of the stage of an ashing processing apparatus is less than a diameter of a mounting unit of the stage of an etching processing apparatus, and the diameter of the mounting unit of the stage of the etching processing apparatus is less than a diameter of an objective item.

5 Claims, 11 Drawing Sheets

U.S. PATENT DOCUMENTS

| | | | |
|---|---|---|---|
| 5,707,485 A * | 1/1998 | Rolfson et al. | 438/716 |
| 5,902,704 A | 5/1999 | Schoenborn et al. | |
| 6,044,534 A | 4/2000 | Seo et al. | |
| 6,531,686 B2 | 3/2003 | Park | |
| 7,262,865 B2 | 8/2007 | Mui et al. | |
| 7,276,447 B1 | 10/2007 | Delgadino et al. | |
| 2002/0066727 A1 | 6/2002 | Park | |
| 2003/0164354 A1 | 9/2003 | Hsieh et al. | |
| 2003/0165755 A1 | 9/2003 | Mui et al. | |
| 2006/0065630 A1* | 3/2006 | Sugimoto | 216/67 |
| 2007/0068900 A1 | 3/2007 | Kim et al. | |
| 2008/0179287 A1 | 7/2008 | Collins et al. | |
| 2008/0194111 A1 | 8/2008 | Delgadino et al. | |
| 2011/0253048 A1 | 10/2011 | Wickramanayaka | |

OTHER PUBLICATIONS

Entire Prosecution of U.S. Appl. No. 13/018,838 to Kobayashi, et al., filed Feb. 1, 2011, entitled "Plasma Processing Apparatus Including Etching Processing Apparatus and Ashing Processing Apparatus and Plasma Processing Method Using Plasma Processing Apparatus".

Japanese Office Action, w/ partial English translation thereof, issued in Japanese Patent Application No. JP 2005-217538 dated Dec. 7, 2010.

U.S. Notice of Allowance issued in U.S. Appl. No. 12/840,847, dated Mar. 2, 2012.

* cited by examiner

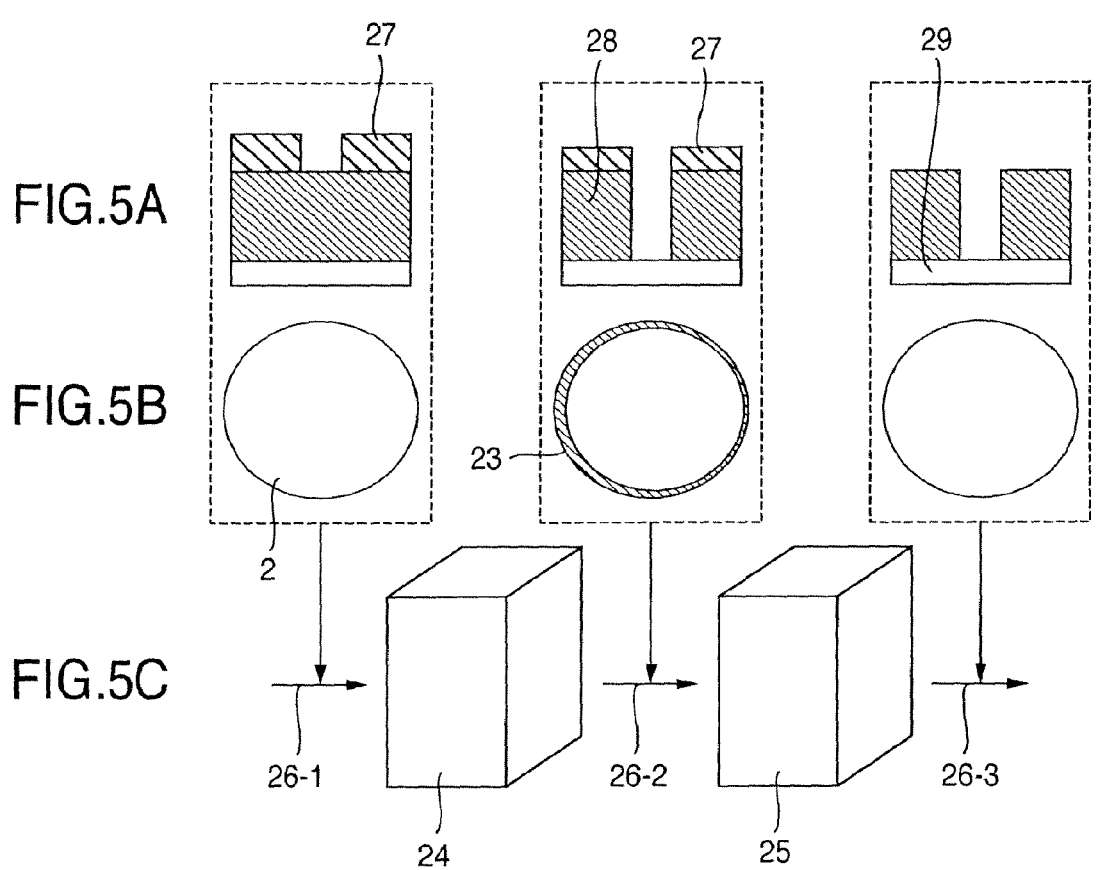

PLASMA PROCESSING APPARATUS

RELATED APPLICATIONS

This application is a Continuation of U.S. application Ser. No. 13/018,838, filed on Feb. 1, 2011 now U.S. Pat. No. 8,197,635, which is a Continuation of U.S. application Ser. No. 11/355,162, filed on Feb. 16, 2006, now abandoned, claiming priority of Japanese Patent Application No. 2005-217538, filed on Jul. 27, 2005, the entire contents of each of which are hereby incorporated by reference.

BACKGROUND OF THE INVENTION

The present invention relates to a plasma processing apparatus, and in particular, to a plasma processing apparatus capable of reducing deposited substance fixed onto an objective item to be processed.

In a production process to produce a semiconductor device such as a Dynamic Random Access Memory (DRAM) and a microprocessor, there are widely employed a plasma etching apparatus and a plasma ashing (resist removing) apparatus which use weakly ionized plasma. With development of a technique to produce a semiconductor device in finer structure, thickness of the resist thin film becomes smaller. As a result of the reduction of the thickness, it is required in the etching that the resist consuming rate is lowered (the selective ratio is improved) and resist damage is suppressed. For this purpose, processing gas with a large deposition property capable of generating a large amount of deposited substance is often employed in many cases.

When such processing gas is employed, deposited substance is fixed onto a periphery of a rear surface of the objective item during the plasma processing. That is, in the etching apparatus, a mounting unit thereof to mount the objective item thereon has a diameter smaller than a diameter of the objective item. Therefore, the periphery of the rear surface of the objective item is exposed during the etching, and the deposited substance is fixed onto the exposed periphery of rear surface of the objective item.

When the deposited substance on the periphery of rear surface peels off from a wafer, for example, during transport thereof, the deposited substance contaminates as a foreign particle the semiconductor device production line, leading to yield reduction. Therefore, removal of the deposited substance is essential to the production line.

To remove the deposited substance on the periphery of the rear surface of the objective item or to prevent deposition of such substance, there have been known a method to supply reactive gas onto the periphery of the rear surface to remove the deposited substance (JP-A-2004-200353) and a method in which a cover is disposed over the periphery of the rear surface to conduct the etching with the cover to thereby prevent the deposited substance from fixing onto the periphery (JP-A-2004-200219).

SUMMARY OF THE INVENTION

According to the prior art, to remove the deposited substance from the periphery of the rear surface of the objective item, it is required that a special protective unit is attached onto the periphery or a special gas is supplied onto the periphery.

When the special protective unit is arranged onto the periphery, the shape of a region etched in the periphery of the objective item is deformed depending on cases. When the special gas is supplied onto the periphery, the etching characteristic is changed depending on cases. Therefore, the inherent object of the technique cannot be achieved.

After the etching processing, it is general to conduct ashing processing to remove resist remaining on the surface of the objective item. In the ashing processing, plasma is generated using processing gas including, for example, oxygen, hydrogen, water, or ammonia. Radicals dissociated in the plasma are radiated onto the objective item to resultantly remove the resist.

Similarly, also the deposited substance fixed onto the periphery of the rear surface of the objective item when the etching processing is conducted using a gas resulting in a large amount of deposited substance can be removed by radiating the plasma employed in the ashing. That is, in the ashing processing, when the plasma used in the ashing or the radicals generated by, for example, dissociation in the plasma is or are radiated onto the periphery of the rear surface, the deposited substance can be removed as in the case of the resist ashing processing.

It is therefore an object of the present invention, which has been devised on the basis of the knowledge described above, to provide a plasma processing technique capable of removing the deposited substance fixed onto the objective item.

To achieve the object according to the present invention, there is provided a configuration adopting constituent units as below.

According to the present invention, there is provided a plasma processing apparatus including an etching processing apparatus including a gas supply unit for supplying an etching gas to a processing chamber, an exhaust unit for lowering pressure in the processing chamber, a mounting stage for mounting and for holding in the processing chamber an objective item to be processed, a transport unit for mounting the objective item on the stage and for transporting from the stage the objective item for which processing is finished, and a plasma generating unit for generating plasma in the processing chamber, and an ashing processing apparatus including a gas supply unit for supplying an ashing gas to a processing chamber, an exhaust unit for lowering pressure in the processing chamber, a mounting stage for mounting and for holding in the processing chamber an objective item to be processed, a transport unit for mounting the objective item on the stage and for transporting from the stage the objective item for which processing is finished, and a plasma generating unit for generating plasma in the processing chamber. A diameter of a mounting unit of the stage of the ashing processing apparatus is less than a diameter of a mounting unit of the stage of the etching processing apparatus. The diameter of the mounting unit of the stage of the etching processing apparatus is less than a diameter of the objective item.

Due to the configuration according to the present invention, it is possible to provide a plasma processing technique capable of removing the deposited substance fixed onto the objective item.

Other objects, features and advantages of the invention will become apparent from the following description of the embodiments of the invention taken in conjunction with the accompanying drawings.

BRIEF DESCRIPTION OF THE DRAWINGS

FIGS. 5A to 5C are diagrams to explain processing steps using a plasma processing apparatus.

DESCRIPTION OF THE EMBODIMENTS

Figure 1:
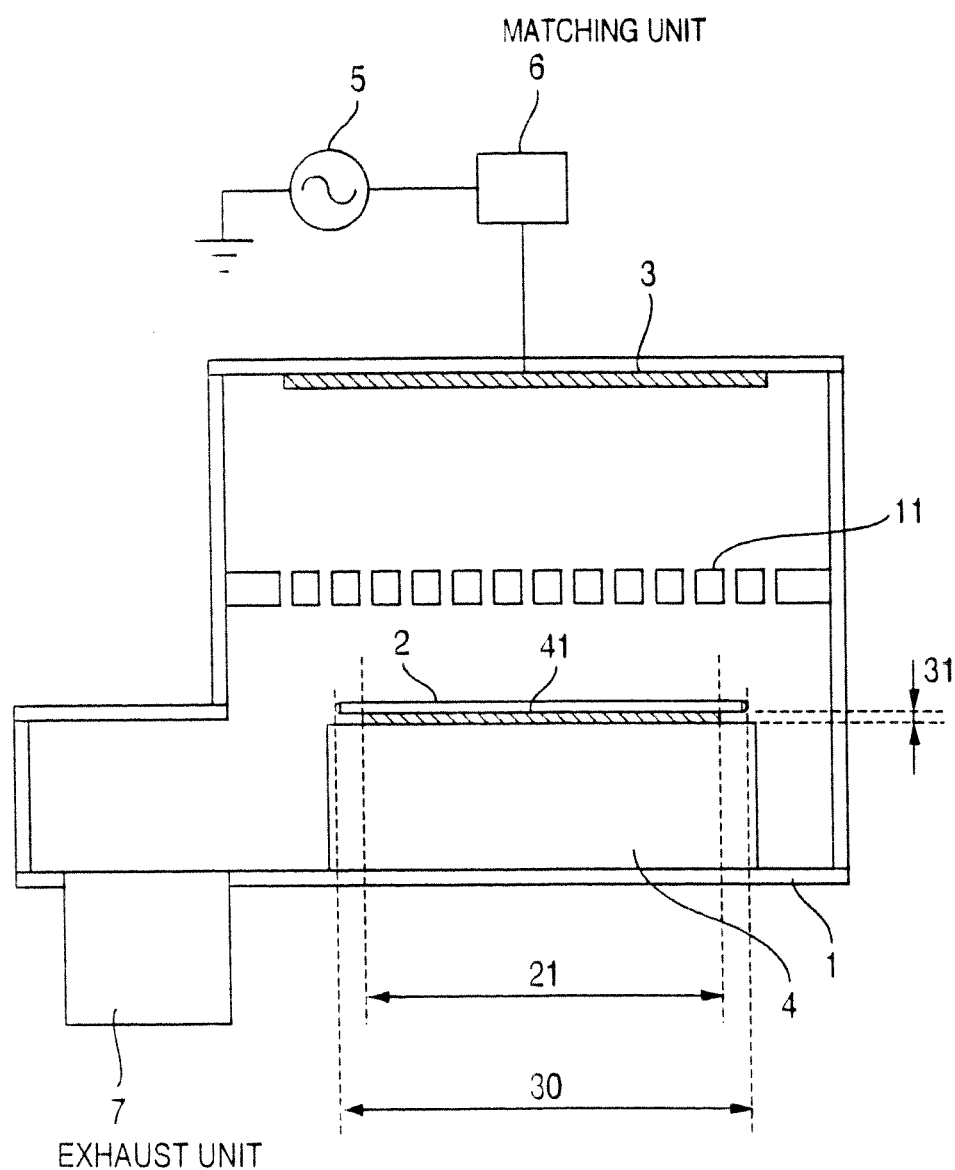
FIG. 1 is a diagram to explain a first embodiment of a plasma processing apparatus of the present invention.

Description will now be given of an embodiment by referring to the drawings. FIG. 1 shows a first embodiment of a plasma processing apparatus of the present invention. As can be seen from FIG. 1, an antenna 3 is arranged in a processing chamber 1 to emit an electromagnetic wave. The antenna 3 is connected via a matching unit 6 to a high-frequency power source 5 to generate plasma. A shower plate 11 is disposed below the antenna 3. Processing gas is delivered into the processing chamber 1 through gas holes formed in the shower plate 11.

To lower the pressure in the processing chamber 1 down to a predetermined pressure, there are disposed an exhaust unit 7 such as a turbo molecular pump and a butterfly valve (not shown) in a stage before the exhaust unit 7 to adjust the pressure in the processing chamber 1 to a predetermined pressure. In the processing chamber 1, an objective item mounting stage 4 to mount thereon an objective item 2 is disposed. In the stage 4, pusher pins (not shown) are disposed to move the objective item 2 upward.

Figure 2:
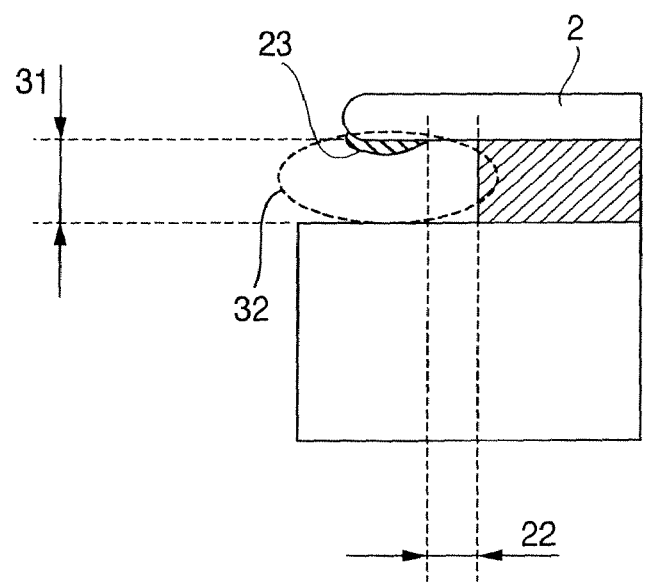
FIG. 2 is a diagram to explain details of a region in the proximity of a periphery of a stage.

FIG. 2 shows details of a region in the proximity of a periphery of the stage 4 of FIG. 1. As shown in FIGS. 1 and 2, a diameter 21 of a mounting unit 41 of the stage 4 is less than a diameter 30 of the objective item 2. Therefore, when the objective item 2 is mounted on the mounting unit 41, the periphery of the objective item 2 is beyond a periphery of the mounting unit 41. As a result, space 32 continuous to processing space of the processing chamber 1 is formed below the periphery of the objective item 2.

Figure 3A:
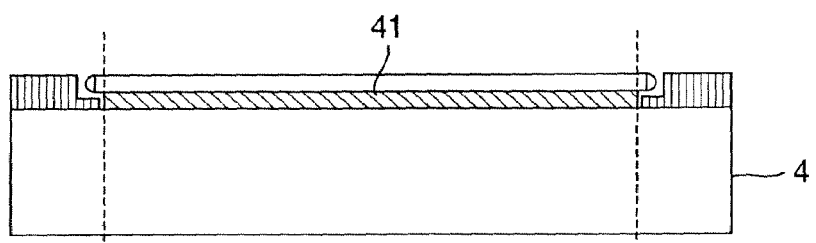
FIGS. 3A and 3B are diagrams to compare the diameter of an objective item mounting unit in an objective item mounting stage of a plasma processing apparatus.
Figure 3B:
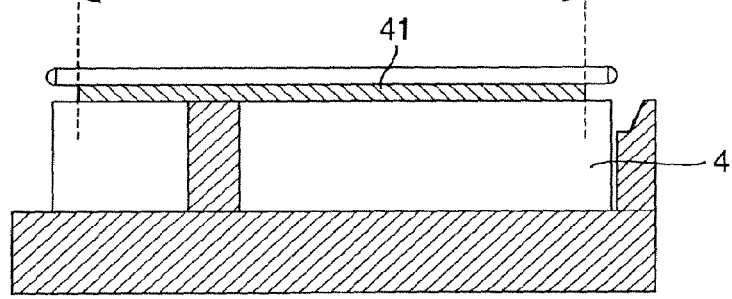

FIGS. 3A and 3B are diagrams to compare a diameter 20 of the mounting unit in the mounting stage (FIG. 3A) of a plasma processing apparatus employed for the etching processing with a diameter 21 of the mounting unit in the mounting stage (FIG. 3B) of a plasma processing apparatus employed for the resist ashing.

To remove the deposited substance fixed onto the periphery of the rear surface of the objective item during the ashing processing, it is required, when the item is mounted on the mounting stage (FIG. 3B) of the plasma processing apparatus employed for the ashing processing, that the deposited substance is not brought into contact with the mounting unit. Therefore, the diameter 21 of the mounting unit in the mounting stage (FIG. 3B) of the plasma processing apparatus for the resist ashing is required to be less than the diameter 20 of the mounting unit in the mounting stage (FIG. 3A) of the plasma processing apparatus for the etching processing.

Figure 4A:
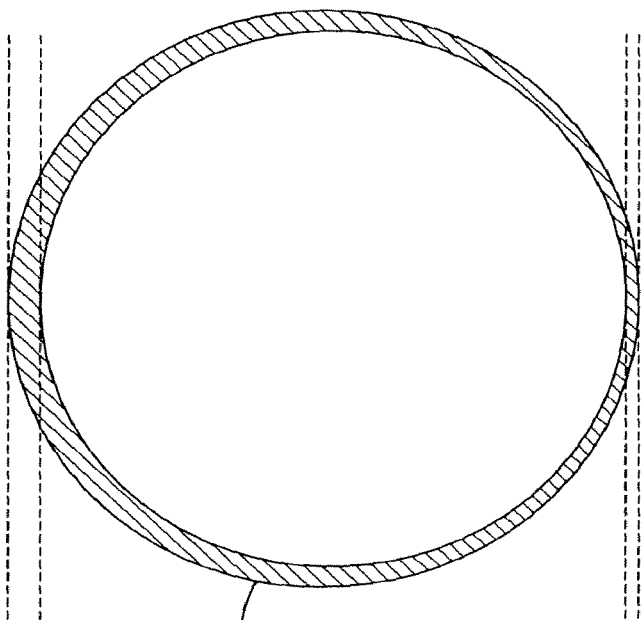
FIGS. 4A and 4B are diagrams showing a distribution example of deposited substance fixed onto a periphery of a rear surface of an objective item.
Figure 4B:

FIGS. 4A and 4B show a distribution example of deposited substance fixed onto a periphery of a rear surface of an objective item. In this example, the deposited substance is more widely distributed in the left-hand side of the rear surface (c of FIG. 4B) than in the right-hand side thereof (d of FIG. 4B).

This indicates that when the objective item is transported onto the mounting stage of the plasma processing apparatus in the etching processing, the objective item is mounted at a position slightly deviated or shifted to the left side relative to the mounting stage. The shift is due to deviation in the transport target position when the objective item is transported by, for example, a transporting robot.

Therefore, the diameter 21 of the mounting unit of the mounting stage disposed in the ashing processing chamber is to be determined in consideration of also the deviation in the transport target position to which the objective item is transported by a transporting robot. Assume that the maximum deviation of the transport target position is $\alpha$ when the objective item is transported onto the mounting stage (FIG. 3A) of the plasma processing apparatus employed for the etching processing, the diameter 20 of the mounting unit in the mounting stage is a, the maximum deviation of the transport target position is $\beta$ when the objective item is transported onto the mounting stage (FIG. 3B) of the plasma processing apparatus employed for the ashing processing, and the diameter 21 of the mounting unit in the mounting stage is b. It is then desirable to hold the relationship as below.

$$b \leq a - (\alpha + \beta) \times 2 \quad (1)$$

If distance 22 (FIG. 2) required between the mounting unit in the mounting stage and the deposited substance on the periphery of the rear surface of the objective item is represented as $\gamma$, it is desirable to hold the relationship as below.

$$b \leq a - (\alpha + \beta + \gamma) \times 2 \quad (2)$$

Assume that the maximum deviation $\alpha$ of the transport target position in the etching processing is 0.5 millimeter (mm), the diameter a of the mounting unit in the mounting stage disposed in the ashing processing chamber is 294 mm, the maximum deviation $\beta$ of the transport target position in the ashing processing is 0.5 mm, and the distance $\gamma$ required between the mounting unit placed on the mounting stage and the deposited substance on the periphery of the rear surface of the objective item is one millimeter. In this situation, it is desirable that the diameter of the mounting unit in the stage placed in the ashing apparatus is equal to or less than 290 mm.

It is desired that a space 32 extending below the periphery of the rear surface of the objective item has a height 31 which allows plasma particles sufficiently reach deposited substance 23 fixed onto the periphery (FIG. 2). For this purpose, the height 31 is set to a length equal to or more than a mean free path of the plasma particles. It is desirable that the height 31 of the space 32 is at least ten times the mean free path.

The processing gas for the resist ashing processing is, for example, a gas prepared by adding several percent of hydrogen to He or Ar, oxygen, nitrogen, ammonia gas, or a mixed gas of hydrogen and nitrogen. The processing gas has a pressure of, for example, about 100 pascal (Pa). In this case, the mean free path of the radicals generated in the gas or the plasma through, for example, dissociation is about 0.1 mm. Therefore, the height 31 of the space 32 is desirably set to at least about one millimeter.

The mounting stage integrally includes a heater to heat the objective item up to about 400° C. The stage may also be constructed to be connected to a power source to electrostatically absorb the objective item. In this case, a surface of the stage is coated with a film primarily including alumina or yttria through thermal spraying. It is also possible to install a mechanism to fix the objective item onto the stage using, for example, electrostatic absorption. In such a configuration, to adjust the temperature of the objective item, a gas of, e.g., helium can be supplied into a space between the stage and the rear surface of the objective item. Therefore, a groove may be arranged in the mounting unit of the stage to flow the gas therethrough. By assuming a case in which the ashing is conducted with a bias applied to the stage, a power source may be connected to the stage to apply a high-frequency bias thereto.

FIGS. 5A to 5C show processing steps using the plasma processing apparatus of the embodiment. In this example, the plasma processing apparatus for the etching processing and the plasma processing apparatus for the resist ashing are independent of each other.

FIG. 5A shows a fine pattern of a front surface of the objective item, FIG. 5B shows a distribution of deposited substance fixed onto a rear surface of the objective item, and FIG. 5C shows the semiconductor producing apparatus. Arrows 26 indicate the flow of the objective item.

First, the objective item 2 is transported into a plasma processing apparatus 24 and an etched layer 28 is then etched using resist 27 as a mask and a processing gas with a large deposition property resulting in a large amount of deposited substance. In this step, the deposited substance 23 is fixed onto a periphery of a rear surface of the objective item 2. Next, the objective item 2 is transported into another plasma processing apparatus 25 for the ashing, and then the resist 27 is removed through an ashing step. In the step, the deposited substance 23 fixed onto the periphery of the rear surface is also removed. That is, according to the present invention, it is not required to use any particular processing step to remove the deposited substance. A reference numeral 29 depicts a lower layer.

Figure 6A:
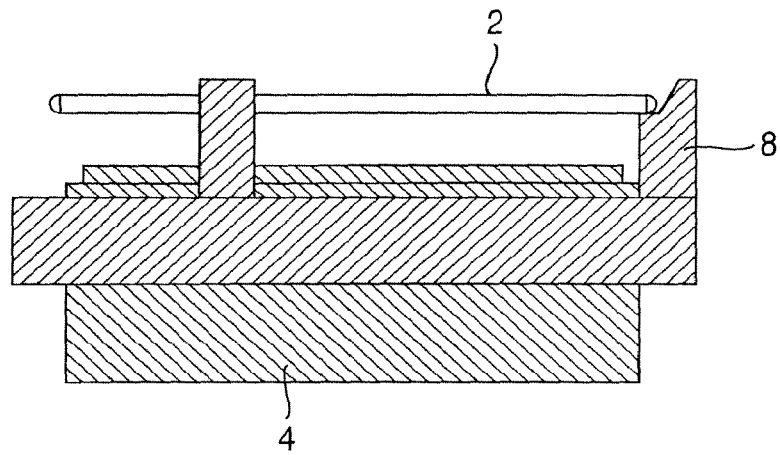
FIGS. 6A to 6C are diagrams to explain a second embodiment of the present invention.
Figure 6B:
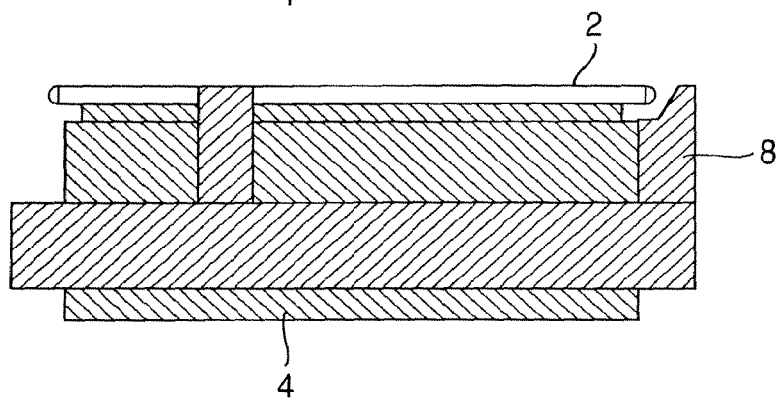
Figure 6C:
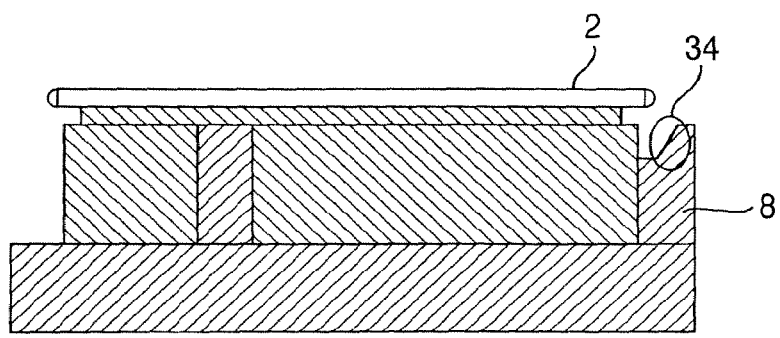
Figure 7:
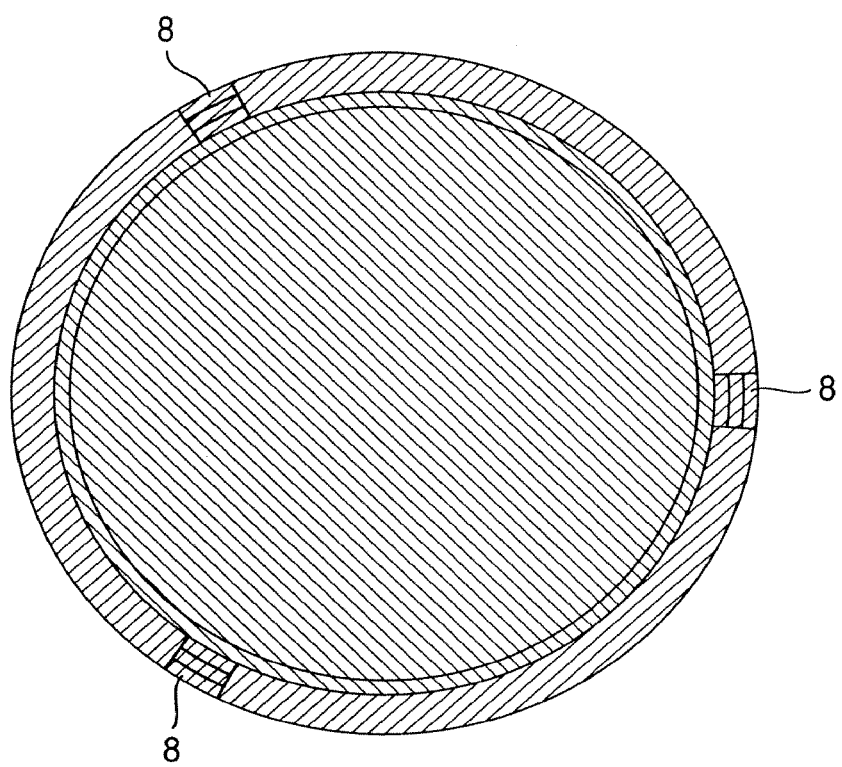
FIG. 7 is a diagram to explain the second embodiment of the present invention.

FIGS. 6A to 6C and FIG. 7 are diagrams to explain a second embodiment of the present invention. FIGS. 6A to 6C are diagrams to explain upward and downward movement of the objective item by pusher pins. FIG. 7 is a top view of the second embodiment (excepting the objective item).

In FIG. 6A, the objective item 2 is lifted over the stage by driving the pusher pins 8 upward. In FIG. 6B, upper ends of the pusher pins 8 and an upper end of the objective item are at the same height relative to the stage. In FIG. 6C, the pusher pins 8 are driven down to a position below the objective item.

The three pusher pins 8 are linked with each other to support the periphery of the objective item 2 with an equal distance therebetween. The pusher pins 8 are moved upward or downward as a unit. When the upper ends of the pusher pins 8 and an upper surface of the objective item 2 are at almost the same height, the pusher pins 8 serve as stopper pins to keep the objective item placed or held on the stage. Each pusher pin 8 has an inclined side surface 34 as shown in FIG. 6C. Therefore, even if the objective item 2 slightly moves in a lateral direction on the stage, the objective item 2 can be placed at an appropriate position when the objective item 2 is mounted on the pusher pins 8 by driving the pusher pins 8 upward.

In the ashing processing, the pusher pins 8 are fully moved downward relative to the objective item 2 as shown in FIG. 6C. As a result, the plasma can be sufficiently radiated also onto the peripheral areas in the neighborhood of the pusher pins 8. In this situation, since the pusher pins 8 are exposed to the plasma, it is favorable to produce the pusher pins 8 with a material such as SiC which rarely causes heavy metal contamination.

As above, according to the embodiment, there can be provided sufficient space below and in lateral directions of the periphery of the rear surface of the objective item for the plasma radiation. Also, the shift from a predetermined target position of the objective item placed on the stage can be prevented and corrected.

Figure 8A:
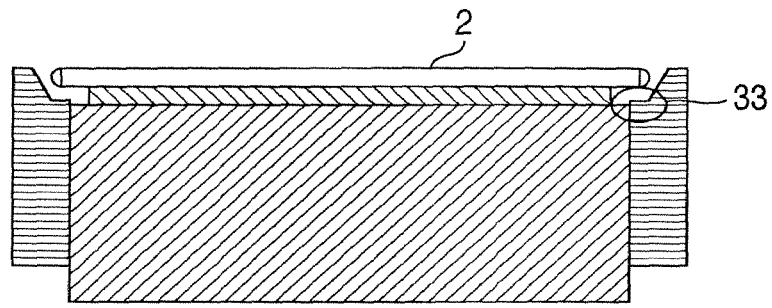
FIGS. 8A to 8C are diagrams to explain a third embodiment of the present invention.
Figure 8B:
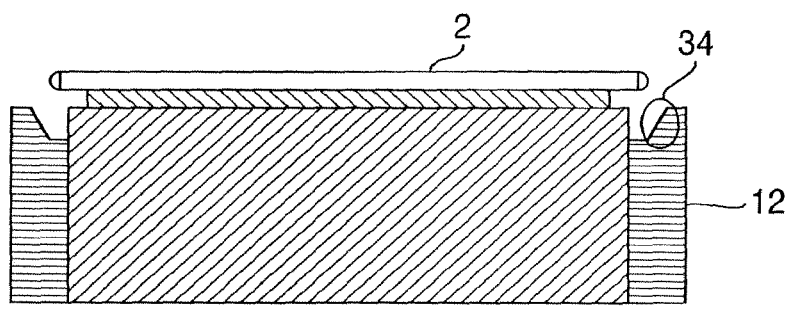
Figure 8C:
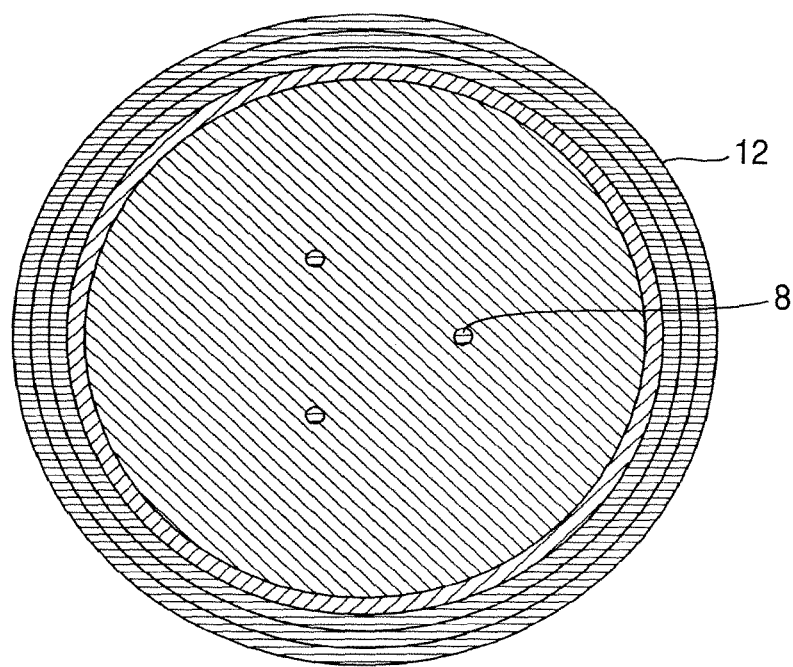

FIGS. 8A to 8C are diagrams to explain a third embodiment of the present invention. In FIGS. 8A to 8C, a reference numeral 12 indicates a guide. The guide 12 is a mechanism to keep the objective item 2 held on the stage and is configured as a circumferentially continuous unit. The guide 12 can be driven upward and downward. During the plasma processing such as the ashing, the guide 12 is driven down to a position below the objective item 2. The guide 12 includes an objective item mounting section 33 and an inclined stopper surface 34 as shown in FIG. 8B. Due to the configuration, when the objective item 2 is lifted by driving the guide 12 upward and is then placed on the stage by driving the guide 12 downward, the mounting position of the objective item 2 can be corrected. According to the third embodiment, the positional shift of the objective item can be more accurately corrected.

Figure 9A:
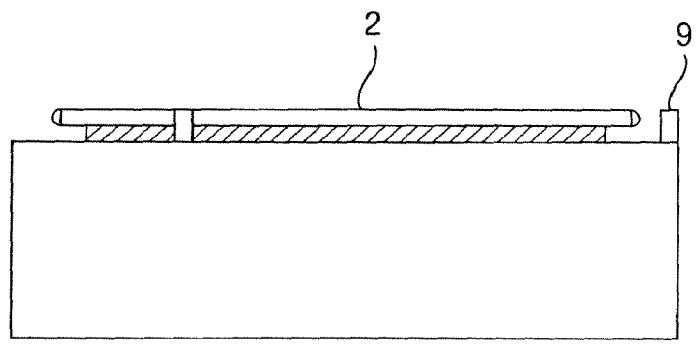
FIGS. 9A and 9B are diagrams to explain a fourth embodiment of the present invention.
Figure 9B:
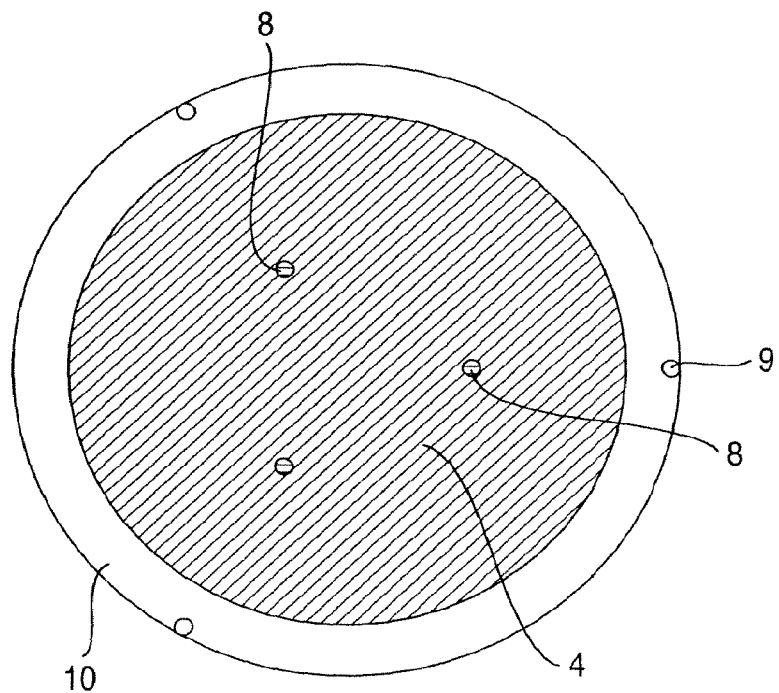

FIGS. 9A and 9B are diagrams to explain a fourth embodiment of the present invention. FIG. 9A is a side view of the mounting stage and FIG. 9B is a top view of the mounting stage (excepting the objective item). In the fourth embodiment, guide pins 9 are arranged on a periphery of the stage to keep the objective item held on the stage.

Each guide pin 9 has a substantially cylindrical shape. A guide pin supporter 10 to support the guide pins 9 can rotate in a circumferential direction. The structure advantageously prevents, during the ashing processing, occurrence of an event in which the deposited substance on the periphery of the rear surface of the objective item cannot be locally removed due to hindrance of the pusher pins 8.

Figure 10:
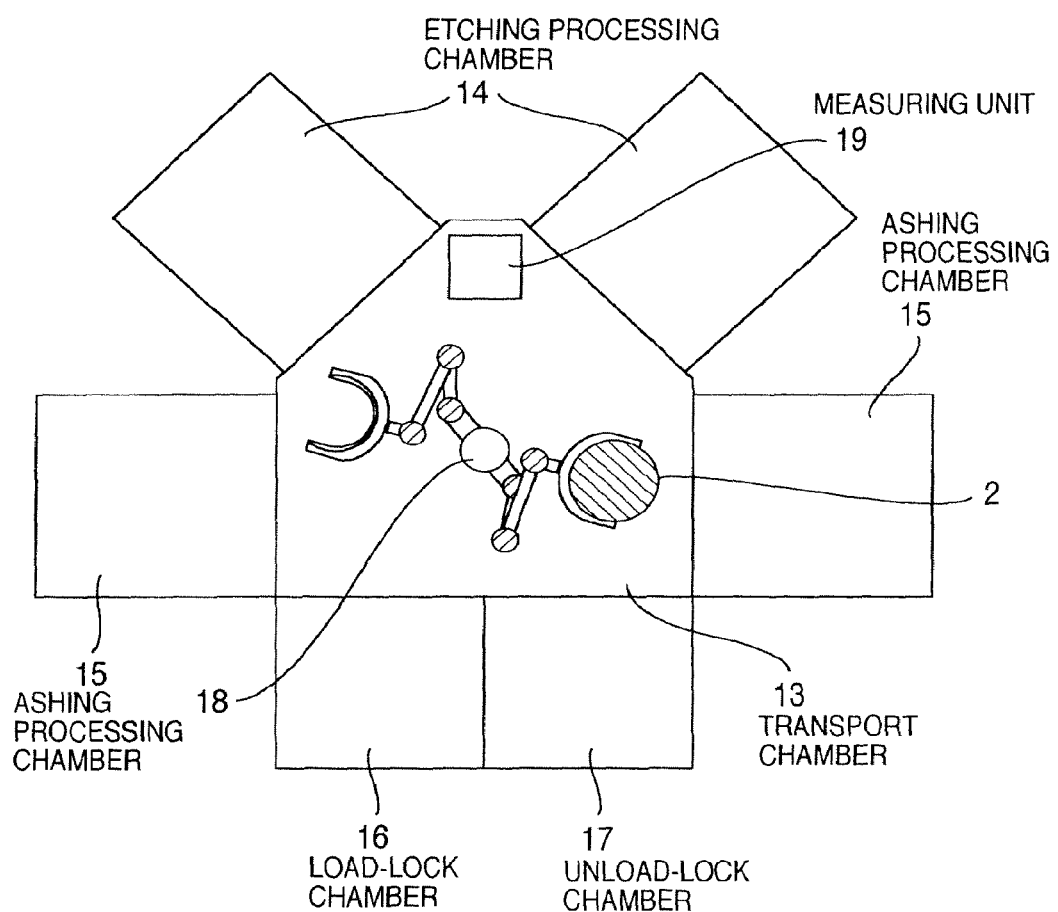
FIG. 10 is a diagram to explain a fifth embodiment of the present invention.

FIG. 10 is a diagram to explain a fifth embodiment of the present invention. Specifically, FIG. 10 is a top view of a plasma processing apparatus according to the fifth embodiment. As can be seen from FIG. 10, the semiconductor processing apparatus includes a load-lock chamber 16 to transport an objective item to be processed from the side of atmosphere to the side of vacuum, an unload-lock chamber 17 to transport the objective item from the vacuum side to the atmosphere side, two etching processing chambers 14 to conduct predetermined etching processing, two ashing processing chambers 15 to remove resist, and a transport chamber 13 to transport the objective item. In the transport chamber 13, a transport robot 18 is installed.

The diameter of the objective item mounting unit of the objective item mounting stage arranged in each etching processing chamber 14 and the diameter of the objective item mounting unit of the objective item mounting stage arranged in each ashing processing chamber 15 satisfy a relationship represented by expression (1) described in conjunction with the first embodiment. In the fifth embodiment, a measuring unit 19 is disposed in the transport chamber 13 to measure a distribution of deposited substance fixed onto the periphery of the rear surface of the objective item.

After the etching processing is conducted for the objective item, the measuring unit 19 measures the distribution of deposited substance fixed onto the periphery of the rear surface of the objective item. Thereafter, the objective item is transported into the ashing processing chamber 15. In the operation, the transport target position is adjusted by aligning a central point of the mounting stage with a central point of an area on which the deposited substance has not been fixed to thereby mount the objective item on the mounting stage. This guarantees that the deposited substance fixed onto the periphery of the rear surface of the objective item is removed through the resist ashing processing.

Figure 11:
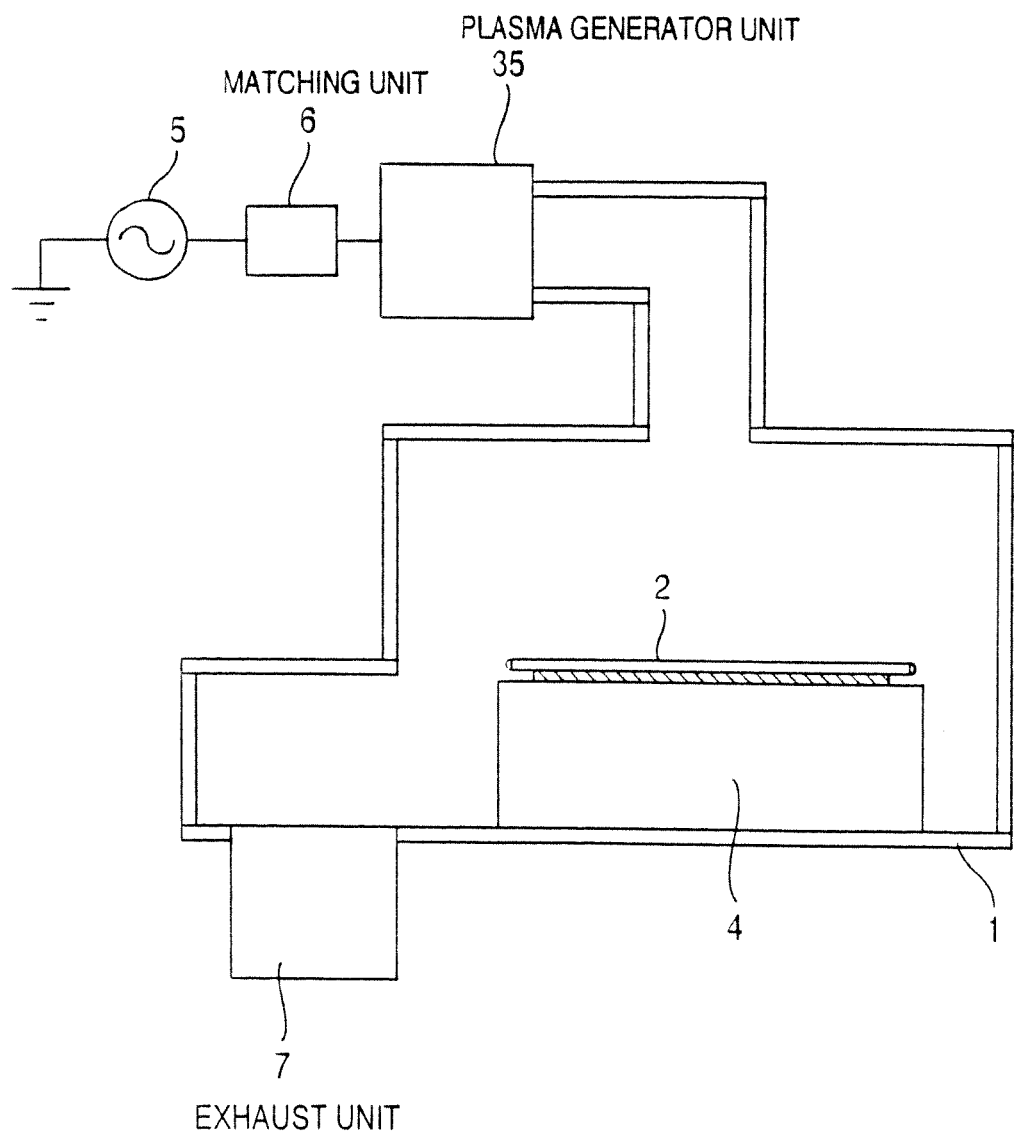
FIG. 11 is a diagram to explain a sixth embodiment of the present invention.

FIG. 11 is a diagram to explain a sixth embodiment of the present invention. The sixth embodiment employs a remote plasma processing apparatus in which a plasma generator unit 35 is disposed apart from the processing chamber 1 and plasma particles generated by the plasma generator unit 35 are delivered into the processing chamber 1. In the plasma processing apparatus, the objective item mounting stage configured as described in conjunction with the first embodiment can be employed as a stage to mount thereon the objective item. Also, the mounting stage configured as described for the two to fourth embodiments can be employed as the mounting stage of the sixth embodiment.

According to the embodiments of the present invention described above, the diameter of the mounting unit in the mounting stage of the ashing processing apparatus is less than that of the mounting unit in the mounting stage of the etching processing apparatus. As a result, the deposited substance fixed onto the periphery of the rear surface of the objective item can be assuredly removed through the resist ashing processing.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus, comprising:
an etching processing apparatus including an etching gas supply unit for supplying an etching gas to an etching processing chamber, a first exhaust unit for lowering pressure in the etching processing chamber, an etching mounting stage for mounting an objective item to be processed in the etching processing chamber, a first mounting unit for mounting the objective item to be processed and arranged on the top of the etching mounting stage, and an etching plasma generating unit for generating plasma in the etching processing chamber;
an ashing processing apparatus including an ashing gas supply unit for supplying an ashing gas to an ashing processing chamber, a second exhaust unit for lowering pressure in the ashing processing chamber, an ashing mounting stage for mounting the objective item to be processed in the ashing processing chamber, a second mounting unit for mounting the objective item to be processed and arranged on the top of the ashing mounting stage, and an ashing plasma generating unit for generating plasma in the ashing processing chamber; and
a transport unit for mounting and unmounting the objective item to the etching mounting stage and the ashing mounting stage for which processing is finished, wherein:
each of the first mounting unit and the second mounting unit has a top flat surface;
a diameter of the top flat surface of the second mounting unit is less than a diameter of the top flat surface of the first mounting unit; and
when the diameter of the top flat surface of the first mounting unit is a, a maximum deviation of a mounting position is α when the objective item is mounted to the etching mounting stage by the transport unit, the diameter of the top flat surface of the second mounting unit is b, a maximum deviation of a mounting position is β when the objective item is mounted to the ashing mounting stage by the transport unit, and a distance required between the second mounting unit and deposited substance on a periphery of a rear surface of the objective item is γ, the plasma processing apparatus holds $b \leq a - (\alpha + \beta + \gamma) \times 2$.

2. The plasma processing apparatus according to claim 1, wherein the ashing processing apparatus comprises:
a plurality of pusher pins for pushing up the objective item mounted on the ashing mounting stage associated therewith, the objective item being pushed over the ashing mounting stage; and
a guide for restricting a position of the objective item on the ashing mounting stage.

3. The plasma processing apparatus according to claim 1, wherein the ashing processing apparatus comprises:
a plurality of pusher pins for pushing up the objective item mounted on the ashing mounting stage associated therewith, the objective item being pushed over the ashing mounting stage; and
a guide including an inclined surface, the inclined surface being inclined downward in a direction to a central position of the ashing mounting stage.

4. The plasma processing apparatus according to claim 1, further comprising:
a measuring unit for measuring a distribution of deposited substance fixed onto a periphery of a rear surface of the objective item transported from the etching processing apparatus, wherein
the transport unit includes a means for aligning a central point of an area of the objective item on which the deposited substance is not fixed with a central point of the ashing mounting stage, when mounting the objective item on the ashing mounting stage.

5. The plasma processing apparatus according to claim 1, wherein the ashing processing apparatus further includes:
a plurality of pusher pins for pushing up the objective item mounted on the ashing mounting stage associated therewith, the objective item being pushed over the ashing mounting stage; and
a guide which is disposed along a circumference of the ashing mounting stage so as to be rotatable therealong, the guide having an upper surface inclined downward toward a central position of the ashing mounting stage.

* * * * *